Dec. 9, 1958 E. O. VANDEVEN 2,864,006

COOLING STRUCTURE FOR SEMICONDUCTOR DEVICES

Filed July 6, 1956

INVENTOR:
EDWIN O. VANDEVEN,

BY Julius J. Zaskalicky
HIS ATTORNEY.

2,864,006
Patented Dec. 9, 1958

2,864,006

COOLING STRUCTURE FOR SEMICONDUCTOR DEVICES

Edwin O. Vandeven, Syracuse, N. Y., assignor to General Electric Company, a corporation of New York Application July 6, 1956, Serial No. 596,175

8 Claims. (Cl. 307—88.5)

This invention relates to the cooling of semiconductor devices, and more particularly to the rapid removal of self-generated heat from semiconductor devices without limiting the electrical applications of these devices.

It has been customary in the construction of semiconductor devices to provide a direct metallic connection between the heat-generating portion of a semiconductor device and a heat-conductive stud or other suitable mounting means which is usually connected to a suitable heat sink, such as a metallic chassis. The heat generated by the transistor device is transferred by conduction through the stud to the heat sink and then dissipated into the ambient temperature. The metallic connection places the heat sink at the same electrical potential as a portion of the semiconductor device, thus limiting its freedom for application in electrical circuits.

Accordingly, it is an object of this invention to provide a new and improved semiconductor structure for facilitating the removal of self-generated heat from semiconductor devices without restricting their application to electrical circuits.

A further object of this invention is to provide a new and improved semi-conductor device which offers a simple and efficient means for electrically isolating the internal elements of a semiconductor device from a heat radiator.

Still another object of this invention is to provide a new and improved semiconductor device in which the heat-generating elements of the semi-conductor device are conductively connected to a heat radiator but electrically insulated therefrom.

Another object of this invention is to provide a new and improved semiconductor device in which the structure used for electrically isolating the heat conductive means from the semiconductor elements is protected from damage by environment, handling and other deleterious influences.

In carrying out the present invention in one illustrative form, at least one reversely poled semiconductor rectifying junction is interposed between the heat-generating electrode of the semiconductor device to be cooled and a heat conductor, whereby the semiconductor electrode is electrically isolated from the metallic heat-conductor by the back resistance of the semiconductor rectifier. This arrangement allows for the conduction of heat from the heat-generating electrode of a semiconductor device to the heat radiator while maintaining the semiconductor device in electrically insulated relationship with the heat radiator.

These and other advantages of this invention may be more clearly understood by the following description taken in connection with the accompanying drawings, and its scope will be apparent from the appended claims.

Figure 1:
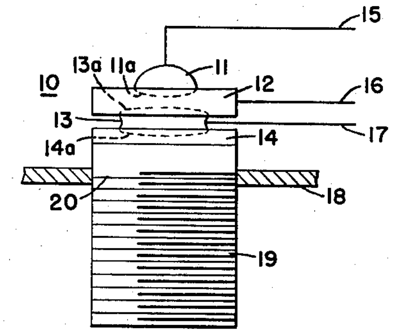
Figure 1 shows a cross-sectional view of one embodiment of this invention as applied to a transistor device.

Referring now to Figure 1, there is shown an illustrative embodiment of the present invention as applied to an alloyed or diffused junction P–N–P transistor 10. Transistor 10 consists of a wafer 12 of N-type germanium or silicon into which an acceptor impurity mass 11, such as indium or germanium or aluminum for silicon, is diffused forming an emitter-base junction 11*a*. Another acceptor impurity mass 13 is diffused into the wafer 12 on the other surface thereof to form the collector-base junction 13*a* of transistor 10.

Leads 15, 16 and 17 are connected to the emitter, base and collector electrodes, respectively, of transistor 10. The impurity mass 13 or collector electrode is also diffused into another wafer of N-type germanium or silicon 14 to form a P–N junction 14*a* therein. Wafer 14 is ohmically attached to heat-conductive stud 20 by soldering, for example. Stud 20 is threaded at 19 and secured to the header 18 in a suitable manner known in the art. Stud 20 is adapted to be bolted to a suitable heat radiator or heat sink, such as a metallic chassis (not shown). Transistor 10 and stud 20 may also be mounted in a casing (not shown) from which the electrical leads 15, 16 and 17 extend to protect the semiconductor element. Since the encasement of this device does not form a part of this invention, and since such techniques are well-known in the art, a description thereof is not included.

The transistor 10 shown in Figure 1 is a P–N–P type transistor. It is separated from the stud 20 by a P–N junction 14*a* formed between collector electrode 13 and wafer 14. Consequently, the collector electrode 13 is in good thermal proximity to the threaded stud 20, but electrically isolated from the stud by the back resistance of the P–N junction 14*a* when the device is operatively connected such that electrode 13 is maintained negative with respect to electrode 14. Heat generated in the base-collector junction 13*a* is conductively transferred by wafer 14 to the threaded stud 20 and to the header 18. From stud 20 and header 18 the heat is transferred to a heat sink and ultimately dissipated into the ambient atmosphere. However, collector 13 is effectively electrically isolated from the stud 20 due to the back resistance furnished by the P–N junction formed by collector electrode 13 and wafer 14. Thus, the application of transistor 10 to electrical circuits is not restricted by having an electrode at the same potential as the heat sink as in many prior art disclosures. There is a small amount of leakage current which passes through the back resistance of semiconductor junction 14*a*. However, if the transistor 10 is utilized as a power transistor, for example, as shown in Figure 2, the leakage current for such an application and in many other applications is of little consequence.

Figure 2:
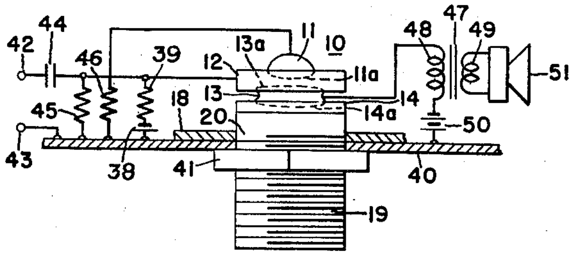
Figure 2 shows the transistor device of Figure 1 as applied in a simplified output circuit.

In Figure 2, the device of Figure 1 is shown as applied in a simpified output circuit. The device is mounted by nut 41 on threaded stud 20 to chassis 40. The output circuit is provided with input terminals 42 and 43, with terminal 43 being connected to the chassis 40. Input terminals 42 and 43 are shunted by a serially connected coupling capacitor 44 and a resistance 45. The connection between resistance 45 and capacitance 44 is connected to base electrode 12. Emitter electrode 11 is coupled to the chassis 40 or ground through resistance 46. A bias source 38 and resistance 39 are connected between base electrode 12 and ground. A transformer 47 having primary and secondary windings 48 and 49, respectively, is provided in the output circuit of the device. Primary winding 48 is connected to collector electrode 13 and to the negative terminal of source 50. The positive terminal of source 50 is connected to ground. Secondary winding 49 is connected to loudspeaker 51.

In operation, signals supplied to input terminals 42 and 43 are passed to resistance 45 by coupling capacitor 44 and are applied to base electrode 12. The signals are amplified by transistor 10 and applied by transformer 47 to loudspeaker 51. Junction 13*a* is biased negatively with respect to ground by source 50. Since transistor 10 is a P–N–P type transistor, such a reverse bias is essential for the transistor to operate. It should also be noted that P–N junction 14*a* is also biased reversely or in the difficult direction of current flow. Consequently, when collector junction 13*a* is biased reversely and transistor 10 conducts, junction 14*a* is also biased reversely and does not conduct an appreciable amount. The only conduction results from the small amount of current drawn through the back resistance of junction 14*a*. Since junction 14*a* is physically connected to junction 13*a*, it is in good thermal contact therewith. Thus, heat generated by junction 13*a* is transferred to stud 20, but junction 13*a* is substantially electrically insulated therefrom.

In Figures 1 and 2, the principle of the invention has been applied for the removal of heat from the collector electrode. It should be understood that it may be equally applicable to the removal of heat from the emitter or base electrodes. Also, the invention is equally applicable for use with an N–P–N type transistor.

Figure 3:
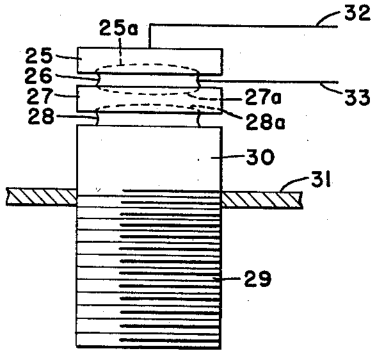
Figure 3 shows a cross-sectional view of another embodiment of this invention as applied to a semiconductor rectifying device.

Figure 3 shows the principles of this invention as applied to a rectifying device from which it is also desirable to transfer self-generated heat while maintaining the electrodes thereof at different potentials from that of the ultimate heat radiator. The semiconductor structure shown in Figure 2 consists of wafers 25 and 27 of N-type semiconductor material, such as germanium or silicon, separated by an acceptor impurity mass 26 which is diffused into portions of wafers 25 and 27 forming a P–N junction 25*a* and 27*a* with wafers 25 and 27, respectively. Another mass of acceptor impurity 28 is diffused into wafer 27, forming a P–N junction 28*a* therewith and is ohmically secured to a heat-conductive stud 30. Stud 30 is threaded at 29 and secured in a suitable manner to the header 31. This entire assembly is adapted to be bolted to a heat sink. Leads 32 and 33 are connected to wafer 25 and acceptor impurity mass 26, respectively, to provide external connections for the electrodes of the resulting rectifier. By providing two P–N junctions 27*a* and 28*a* back-to-back and mounting them on a heat-conductive stud, the junction 25*a* is effectively thermally associated with the conductive stud, but electrically isolated therefrom by the back resistance of either rectifying junction 27*a* or 28*a*, for example, by junction 27*a* when electrode 33 is negative or by junction 28*a* when electrode 33 is positive. Consequently, the potential existing at electrode 33 of P–N junction 25*a* is not applied to the stud 30, header 31 or the heat radiator, and its electrical circuit application is not restricted thereby. It should be noted that two P–N junctions 27*a* and 28*a* are interposed between electrode 33 and stud 30. This provides electrical isolation regardless of whether electrode 33 is positive or negative. Such an arrangement is equally applicable to the transistor arrangement of Figure 1.

Although this invention is described with respect to diffused or alloyed junction type semiconductor devices, it may be equally applicable to other types of semiconductor devices, such as grown-junction types for example. It is also obvious that different types of semiconductor material with different types of donor and acceptor activator materials or impurities may be utilized in practicing this invention. The invention is also applicable to multiple electrode semiconductor devices, such as tetrodes.

Since other modifications varied to fit particular operating requirements and environmnets will be apparent to those skilled in the art, the invention is not considered limited to the examples chosen for purposes of disclosure and covers all modifications and changes which do not constitute departures from the true spirit and scope of this invention.

What I claim as new and desire to secure by Letters Patent of the United States is:

1. A semiconductor structure for removing self-generated heat from a semiconductor device comprising a body of semiconductor material having a first and second region of one conductivity type separated by a third region of opposite conductivity type to form a first junction with said first region and a second junction with said second region, a second body of semiconductor material of said opposite conductivity type having a region of said one conductivity type forming a junction within said second body, means for connecting the region of said second body of said one conductivity type to said second region, and a heat conductive stud secured to said second body of semiconductor material.

2. A semiconductor construction for removing self-generated heat from a semiconductor device comprising a first body of semiconductor material of one conduction characteristic, a pair of regions on said body of semiconductor material having a different conduction characteristic than said body of semiconductor material, a second body of semiconductor material having the same conduction characteristic as said first body of semiconductor material secured to one of said regions on said first body of semiconductor material, and a heat conductive stud being conductively secured to said second body of semiconductor material.

3. In a semiconductor structure for removing self-generated heat from a semiconductor device, comprising a semiconductor device having at least one P–N junction therein, a second P–N junction conductively mounted in serial relationship on said first-named P–N junction, and a heat conductive mounting means conductively secured to said second P–N junction, whereby heat generated in said first-named P–N junction is transferred by conduction through said second P–N junction to said heat conductive mounting means.

4. A transistor device comprising a body of semiconductor material having an emitter and collector region of one conductivity type separated by a base region of the opposite conductivity type, a second body of semiconductor material of said one conductivity type having a region of said opposite conductivity type forming a P–N junction within said body, means for connecting said second body of said one conductivity type to said emitter region, and a heat conductive stud secured to said region of opposite conductivity type of said second body of semi-conductor material.

5. A transistor device comprising a body of semiconductor material having an emitter and collector region of one conductivity type separated by a base region of the opposite conductivity type, a second body of semiconductor material of said one conductivity type having a region of said opposite conductivity type forming a P–N junction within said body, means for connecting said second body of one conductivity type to said collector region, and a heat conductive stud secured to said region of opposite conductivity type of second body of semiconductor material.

6. A transistor device comprising a body of semiconductor material having an emitter and collector region of one conductivity type separated by a base region of opposite conductivity type, a second body of semi-conductor material of said one conductivity type having a region of said opposite conductivity type forming a P–N junction within said body, means for connecting said second body of said one conductivity type to said emitter region, and a heat conductive stud secured to said region of opposite conductivity type of said second body of semi-conductor material, means for biasing the P–N junction of said second body non-conductive.

7. A semiconductor structure for removing self-generated heat from a semiconductor device comprising a body of semiconductor material having a first and second region of one conductivity type separated by a third region of opposite conductivity type to form a first junction with said first region and a second junction with said second region, a second body of semiconductor material of said one conductivity type having a region of said opposite conductivity type forming a junction within said second body, means for connecting said second body of one conductivity type to said second region, and a heat conductive stud secured to said region of opposite conductivity type of said second body of semiconductor material, means for connecting one of the regions of said one conductivity type of said semiconductor body to a heat sink.

8. A semiconductor device comprising a pair of bodies of semiconductor material each having a first and second region of one conductivity type separated by a third region of opposite conductivity type to form a first junction with said first region and a second junction with said second region, means for connecting the first regions of said semiconductive bodies together, means for connecting one of the third regions of said semiconductive bodies to a heat sink.

References Cited in the file of this patent

UNITED STATES PATENTS 2,725,505 Webster et al. ---------- Nov. 29, 1955